United States Patent
Chengalva

(10) Patent No.: US 6,808,422 B2
(45) Date of Patent: Oct. 26, 2004

(54) FILTER INSERT FOR AN ELECTRICAL CONNECTOR ASSEMBLY

(75) Inventor: Mahesh K. Chengalva, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/391,905

(22) Filed: Mar. 19, 2003

(65) Prior Publication Data

US 2004/0185717 A1 Sep. 23, 2004

(51) Int. Cl.[7] ............................................... H01R 12/00
(52) U.S. Cl. ........................... 439/620; 439/67; 439/77
(58) Field of Search ............................... 439/620, 225, 439/67, 77, 65, 55, 95; 333/204, 205, 185, 182, 254; 361/749, 785, 774, 818, 811, 820; 174/267, 266, 264

(56) References Cited

U.S. PATENT DOCUMENTS

| | | | | |
|---|---|---|---|---|
| 4,121,044 A | * | 10/1978 | Hadersbeck et al. | ........ 174/254 |
| 4,950,173 A | * | 8/1990 | Minemura et al. | ............ 439/82 |
| 4,970,624 A | * | 11/1990 | Arneson et al. | ............ 361/749 |
| 5,384,435 A | * | 1/1995 | Fuerst et al. | ................. 174/262 |
| 5,415,569 A | | 5/1995 | Colleran et al. | ............ 439/620 |
| 6,086,384 A | * | 7/2000 | Fuerst et al. | ................... 439/67 |
| 6,413,119 B1 | | 7/2002 | Gabrisko, Jr. et al. | |

* cited by examiner

*Primary Examiner*—Gary Paumen
*Assistant Examiner*—Edwin A. Leon
(74) *Attorney, Agent, or Firm*—Stefan V. Chmielewski

(57) ABSTRACT

A filter insert for a terminal connector includes a rigid substrate and low-cost interference fit connections between the filter insert circuitry and the connector terminals. In a first embodiment, the insert includes a flexible circuit bonded to the rigid substrate, and the substrate is provided with over-sized openings that the terminals pass through without interference. A second embodiment is like the first, except that the filter circuit traces are formed directly on the rigid substrate, and the substrate material backing the terminal connection sites is removed to form the over-sized openings.

4 Claims, 2 Drawing Sheets

FILTER INSERT FOR AN ELECTRICAL CONNECTOR ASSEMBLY

TECHNICAL FIELD

The present invention relates to an electrical connector assembly, and more particularly to a filter insert that is electrically coupled to the connector terminals for filtering electrical signals carried by the terminals.

BACKGROUND OF THE INVENTION

Most electronic modules include a connector assembly for coupling the module to power supplies and external components such as sensors and actuators. Referring to FIG. 1A, a typical connector assembly 10 includes a matrix of terminals 12 supported in an insulator block 14 that passes through a wall of the module housing 16. The inboard ends of the terminals 12 are electrically coupled to a circuit board 18 enclosed by the module housing 16, while the outboard ends of the terminals 12 are accessible for electrical interconnection with a complementary connector and electrical cable (not shown). A filter insert 20 disposed between the insulator block 14 and the circuit board 18 is electrically coupled to the terminals 12, and includes filter elements such as capacitors for filtering electrical signals carried by the terminals 12. In many applications, such filtering is necessary in order to attenuate unwanted electrical noise as well as to reduce radiated electromagnetic emissions due to operation of the module. The insert 20 is provided with a matrix of openings 22 as seen in FIG. 1B, and is installed by aligning the openings 22 with the terminals 12, and pushing the insert 20 onto the terminal matrix. An encapsulating material 24 is injected into the region between the circuit board 18 and the insulator block 14 as shown in FIG. 1A for improved environmental sealing.

The filter insert 20 can be formed on a circuit board, on a rigid plastic substrate or on a flexible substrate. In cases where the insert is formed on a circuit board or a rigid plastic substrate, the terminals 12 can be soldered to metallic pads adjacent to the openings 22, or the openings 22 can be through-plated with metal so that a reliable electrical connection is established by virtue of an interference fit between the terminals 12 and the through-plated metal. An interference fit between the terminals 12 and the filter insert circuitry can also be achieved in cases where the insert 20 is formed on a flexible substrate by extending the circuit traces across the openings 22, leaving an opening that is smaller than the outline of a terminal 12. An example of a filter insert formed on a plastic substrate with through-plated openings is shown in the U.S. Pat. No. 6,413,119 to Gabrisko et al., while an example of a filter insert formed on a flexible substrate is disclosed in the U.S. Pat. No. 5,415,569 to Colleran et al.

Of the various filter insert designs discussed above, the flexible circuit approach is particularly attractive from a cost stand point, primarily because the interference fit electrical connections between the connector terminals 12 and the filter insert 20 permits low insertion force (compared to the through-plated approach) and eliminates the expense of soldering and/or through-plating. However, reliability testing has shown that when the module is subjected to extended thermal cycling, the thermal expansion and contraction of the encapsulating material 24 is transmitted to the flexible circuit, which in turn, leads to fatigue-related failures of the solder joints and traces formed on the circuit. Accordingly, what is needed is an improved filter insert having the low insertion force and low cost advantages of a flexible circuit, but with improved thermal cycle reliability.

SUMMARY OF THE INVENTION

The present invention is directed to an improved filter insert for a terminal connector, where the filter insert comprises a rigid substrate for good thermal cycle reliability and low-cost interference fit electrical connections between the filter insert and the connector terminals. In a first embodiment, the filter insert comprises a flexible circuit bonded to the rigid substrate, and the substrate is provided with over-sized openings that the terminals pass through without interference. A second embodiment is like the first, except that the filter circuit traces are formed directly on the rigid substrate, and the substrate material backing the terminal connection sites is removed to form the over-sized openings. The thermal bending stress applied to the traces and solder joints of the filter insert of this invention is considerably reduced compared to the flexible circuit approach, and the insertion force of the filter insert is essentially the same as with a flexible circuit due to the over-sized substrate openings.

DESCRIPTION OF THE PREFERRED EMBODIMENT

Figure 1A:
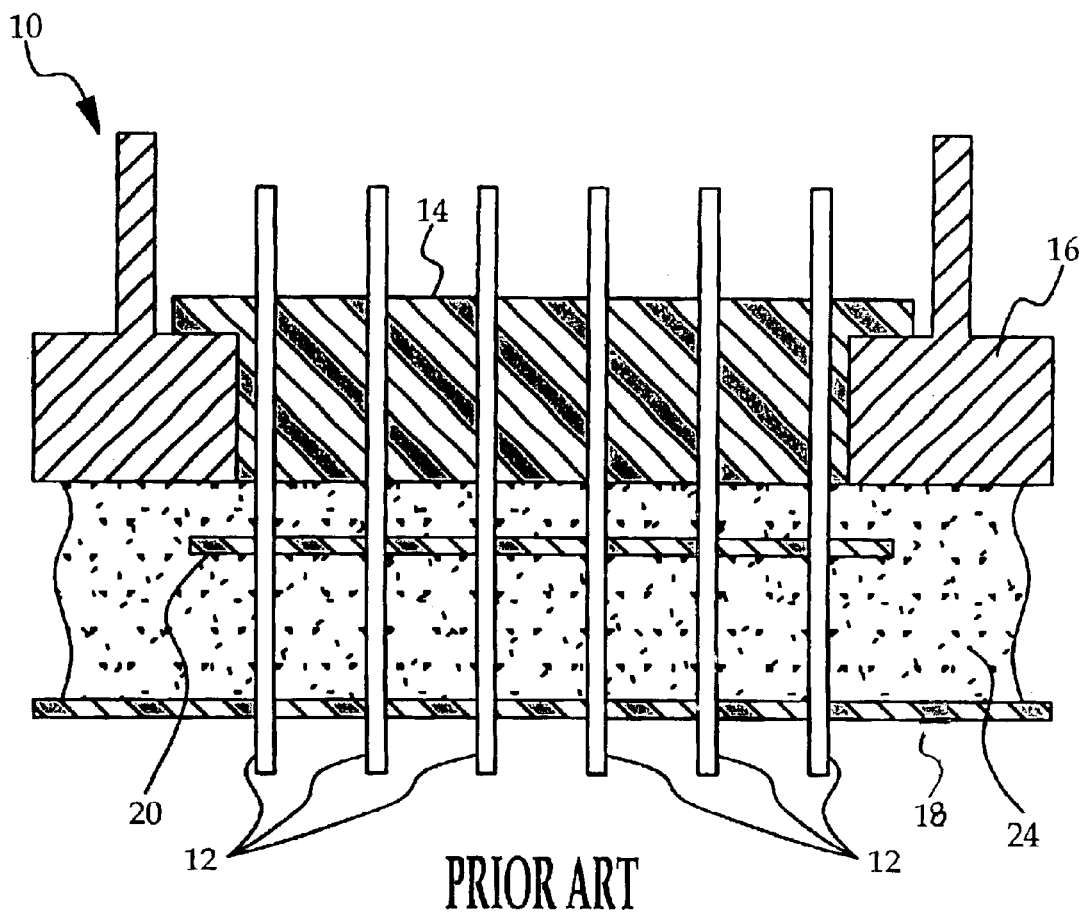
FIG. 1A is a cross-sectional view of a prior art connector assembly including a filter insert.
Figure 1B:
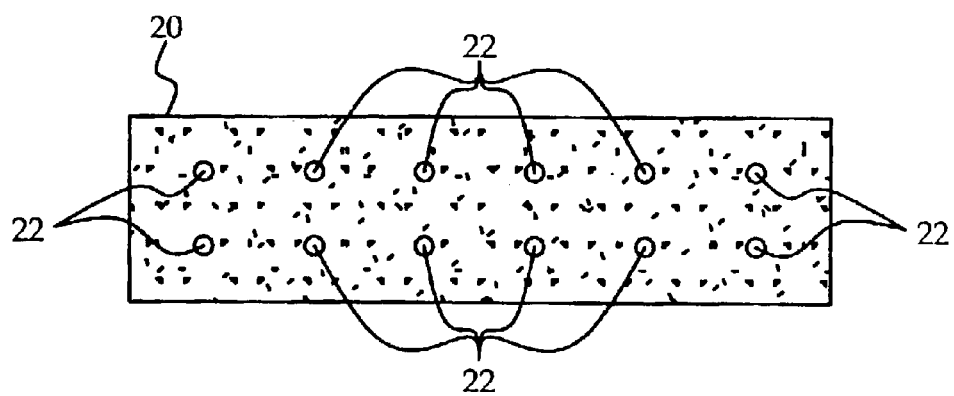
FIG. 1B is a elevation view of the filter insert depicted in FIG. 1A.
Figure 2:
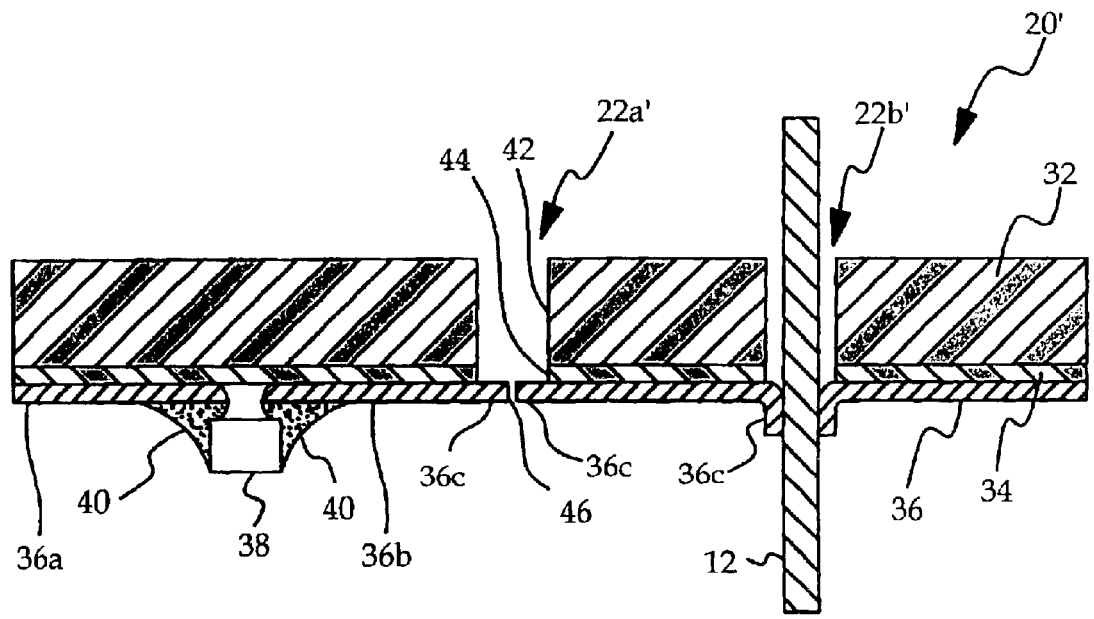
FIG. 2 is a cross-sectional view of a filter insert according to a first embodiment of this invention.

Referring to FIG. 2, the reference numeral 20' generally designates a filter insert according to a first embodiment of this invention. In this embodiment, the filter insert includes a rigid substrate 32, a flexible film 34 adhesively bonded to the substrate 32, and an electrical filter circuit including the copper traces 36 formed on the exposed surface of the film 34. The substrate 32 is preferably formed of FR4 printed circuit board, but can be any rigid material having a coefficient of thermal expansion that closely matches that of the copper traces 36. The flexible film is preferably formed of polyimide, but can be any flexible material having a coefficient of thermal expansion that closely matches that of the copper traces 36. In addition to the traces 36, the filter circuit includes filter elements such as the capacitor 38, illustrated as a surface mount device attached to the trace segments 36a and 36b by the solder joints 40. In a typical implementation, the capacitors 38 form part of a filter network for low-pass filtering electrical signals carried by the connector terminals 12.

The openings 22a', 22b' in the filter circuit 20' are formed by concentric openings 42, 44, 46 in the substrate 32, the flexible circuit 34 and the copper traces 36, as best seen in reference to the opening 22a'. The openings 42 and 44 are over-sized relative to the connector terminals 12, and offer no resistance to the terminals 12 when the filter insert 20' is installed on the terminal matrix. In contrast, the opening 46 in the copper trace 36 is under-sized relative to the terminals 12. As indicated at the opening 22b', the terminals 12 deform the copper trace material 36c adjacent to the openings 46 as the filter insert 20' is installed on the terminal matrix, forming an interference electrical connection between the terminals 12 and the copper trace segments defining the openings 46. The cumulative resistance offered by the various openings 46 to the installation of filter insert 20' is relatively small, and virtually identical to that of the prior art flexible circuit filter insert. In usage, mechanical stresses due to expansion and contraction of the encapsulating material 24 during thermal cycling of the module are borne by the rigid substrate 32, drastically reducing the stress borne by the circuit traces 36 and solder joints 40 as compared to the prior art flexible circuit filter insert. Consequently, the reliability of the filter insert 20' is significantly improved compared to that of the prior art flexible circuit filter insert.

Figure 3:
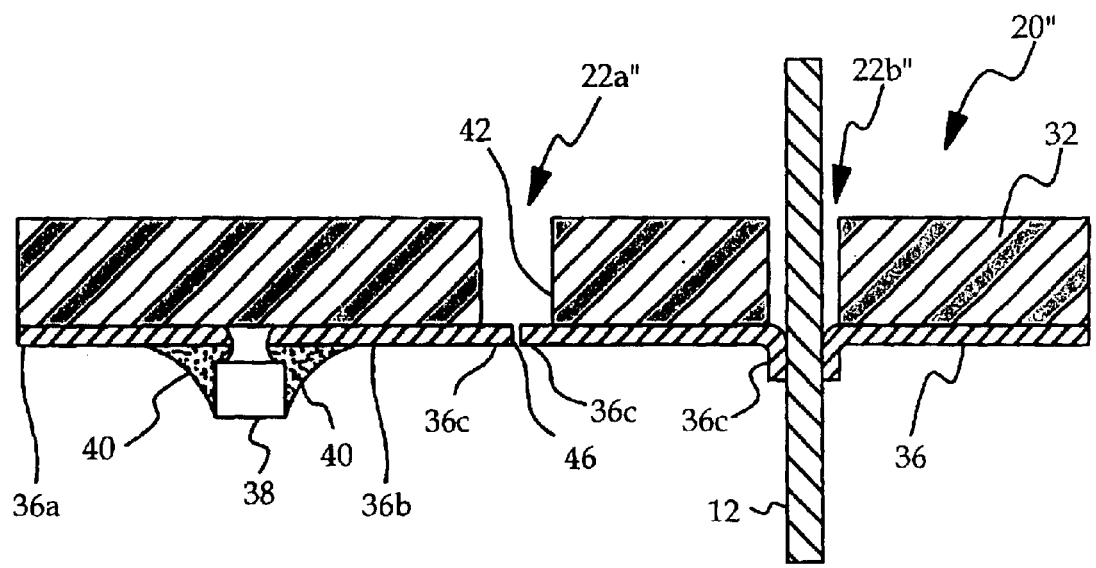
FIG. 3 is a cross-sectional view of a filter insert according to a second embodiment of this invention.

FIG. 3 depicts a filter insert 20" according to a second embodiment of this invention. The filter insert 20" is like the filter insert 20', except that the copper traces 36 are formed directly on the rigid substrate 32. In this case, the openings 22a" and 22b" are defined by two concentric openings: the opening 42 in the substrate 32 and the opening 46 in the copper trace material 36c. Thus the filter insert 20" provides the same low insertion force and high thermal cycle reliability as the filter insert 20', but at a reduced cost due to the elimination of the flexible film 34 and the adhesive for bonding the film 34 to the substrate 32.

The filter inserts 20' and 20" may be easily manufactured using conventional printed circuit processing techniques, as will be appreciated by those skilled in the art. In regard to the filter insert openings, the copper trace openings 46 may be formed by photo-etching, the flexible film openings 44 may be formed by selective etching following formation of the circuit traces 36, and the substrate openings 42 may be formed by drilling.

In summary, the present invention provides a reliable, low insertion force and low-cost filter insert for usage in conjunction with electrical connectors for the purpose of attenuating unwanted electrical noise and reducing radiated electromagnetic emissions. While the filter insert of this invention has been described in reference to the illustrated embodiments, it is anticipated that various modifications in addition to those mentioned above will occur to those skilled in the art. In this regard, it should be understood that filter inserts including these and other modifications may fall within the scope of this invention, which is defined by the appended claims.

What is claimed is:

1. A filter insert for insertion on an array of electrical terminals in a connector assembly, the filter insert comprising:
   a rigid substrate having first openings through which said electrical terminals initially pass when said filter insert is inserted on said array of electrical terminals, said first openings being over-sized relative to said electrical terminals so that said electrical terminals pass through said first openings without interference; and
   filter circuitry supported on a surface of said rigid substrate facing away from said connector assembly for filtering electrical signals carried by said electrical terminals, including conductor traces having second openings that are concentric with said first openings, said second opening being under-sized relative to said electrical terminals so that said conductor traces deform away from said rigid substrate when said electrical terminals pass through said second openings, forming interference fit electrical connections between said conductor traces and said electrical terminals.

2. The filter insert of claim 1, wherein said filter circuitry is formed on a flexible film, said flexible film is removed in regions aligned with said first openings, and said flexible film is adhesively bonded to said rigid substrate.

3. The filter insert of claim 1, wherein said filter circuitry is formed on said rigid substrate.

4. The filter insert of claim 1, wherein said rigid substrate has a thermal coefficient of expansion that is substantially equal to a thermal coefficient of expansion of said conductor traces.

* * * * *